United States Patent [19] [11] Patent Number: 4,758,869
Eitan et al. [45] Date of Patent: Jul. 19, 1988

[54] NONVOLATILE FLOATING GATE TRANSISTOR STRUCTURE

[75] Inventors: Boaz Eitan, Sunnyvale; Reza Kazerounian, Fremont, both of Calif.

[73] Assignee: WaferScale Integration, Inc., Fremont, Calif.

[21] Appl. No.: 902,236

[22] Filed: Aug. 29, 1986

[51] Int. Cl.$^4$ ............ H01L 29/78; H01L 27/14; H01L 29/04; H01L 29/34
[52] U.S. Cl. ................ 357/23.5; 357/23.1; 357/30; 357/54; 357/59; 357/84
[58] Field of Search ............ 357/23.5, 84, 30, 30 D, 357/30 I, 30 K, 30 L, 30 R, 23.1, 59 C, 59 D, 59 E, 59 G, 59 K, 54

[56] References Cited

U.S. PATENT DOCUMENTS

| 4,258,378 | 3/1981 | Wall | 357/23.5 |
|---|---|---|---|
| 4,267,558 | 5/1981 | Guterman | 357/23.5 |
| 4,302,766 | 11/1981 | Guterman et al. | 357/23.5 |
| 4,317,273 | 3/1982 | Guterman et al. | 357/23.4 |
| 4,376,947 | 3/1983 | Chin et al. | 357/23.5 |
| 4,376,983 | 3/1983 | Tsaur et al. | 357/84 |
| 4,409,723 | 10/1983 | Harari | 29/571 |
| 4,519,050 | 5/1985 | Folmsbee | 365/53 |
| 4,527,259 | 7/1985 | Watanabe | 357/23.5 |
| 4,581,622 | 4/1986 | Takasaki et al. | 357/23.5 |

FOREIGN PATENT DOCUMENTS

| 60-45067 | 3/1985 | Japan | 357/23.5 |
|---|---|---|---|
| 2074788 | 11/1981 | United Kingdom . | |
| 2097581 | 11/1982 | United Kingdom | 357/84 |

OTHER PUBLICATIONS

Alan Folmsbee, "Prom Cell Made With An EPROM Process", 7/83, pp. 574 to 576, IEEE publication.
Folmsbee, Alan C., "Prom Cell Made With An EPROM Process", International Electron Devices Meeting 1983, Technical Digest, pp. 574-576.
Spaw et al., "A 128K EPROM With Redundancy", IEEE International Solid-State Circuits Conference Digest of Technical Papers, Feb. 10-12, 1982, pp. 112-113.

Primary Examiner—James Carroll
Assistant Examiner—Ngan Ngo
Attorney, Agent, or Firm—Kenneth E. Leeds; Alan H. MacPherson; Paul J. Winters

[57] ABSTRACT

A field effect transistor includes a source region, a drain region, and a channel region formed in a semiconductor substrate and a floating gate and a control gate formed over the substrate. An opaque cover (typically aluminum) is formed over but electrically insulated from the transistor to prevent light from striking and affecting the electrical charge on the floating gate. The periphery of the opaque cover ohmically contacts the semiconductor substrate, thereby limiting the amount of light reaching the floating gate, except where the source and drain extend inwardly beyond the periphery of the opaque cover. The control gate extends over a portion of the substrate surrounding the transistor, and helps hinder light from reaching the floating gate. In addition, semiconductor material formed concurrently with the control gate extends over the source and drain regions, thereby providing additional shading.

6 Claims, 4 Drawing Sheets

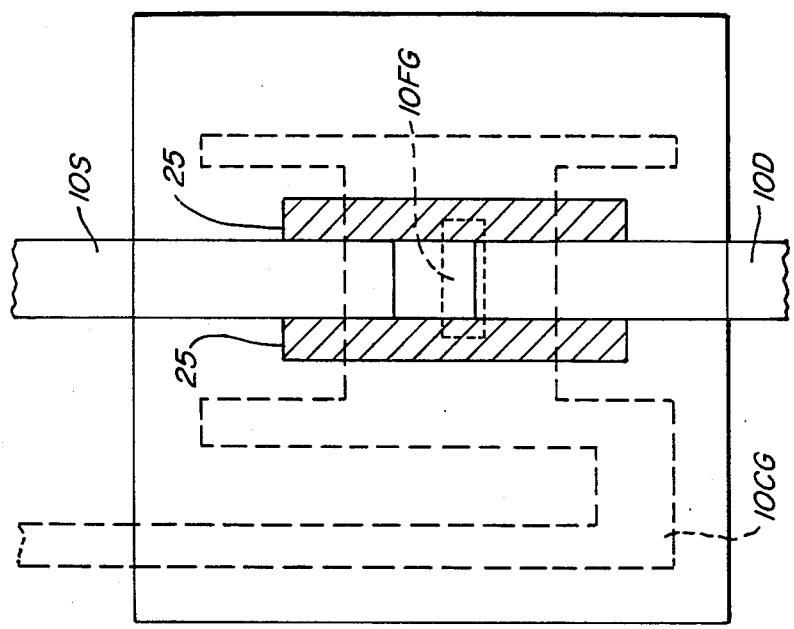
FIG._1a.
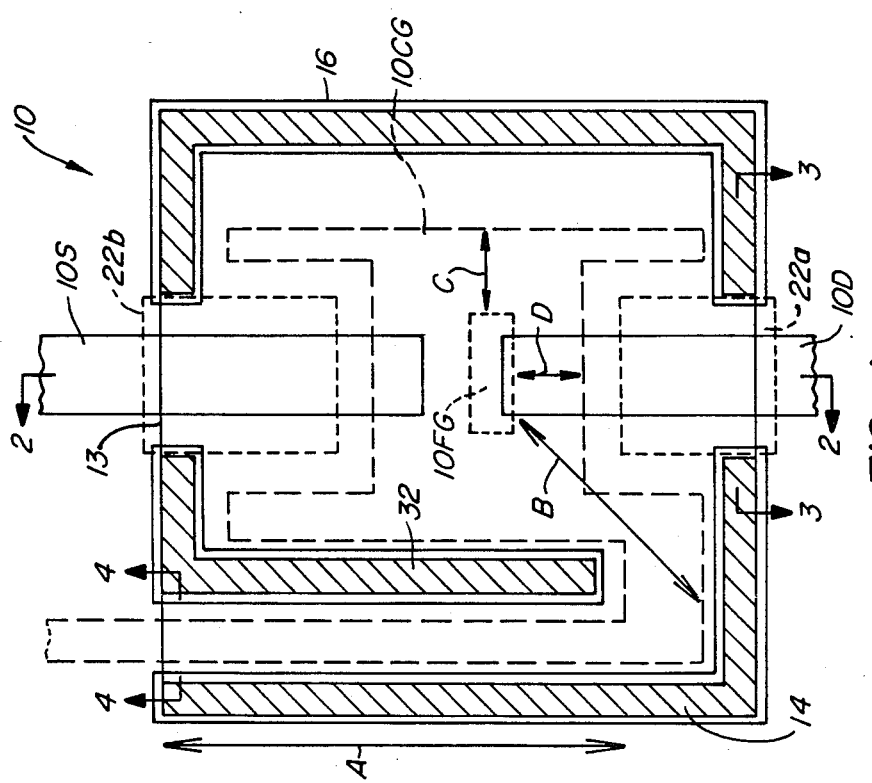
FIG._1.

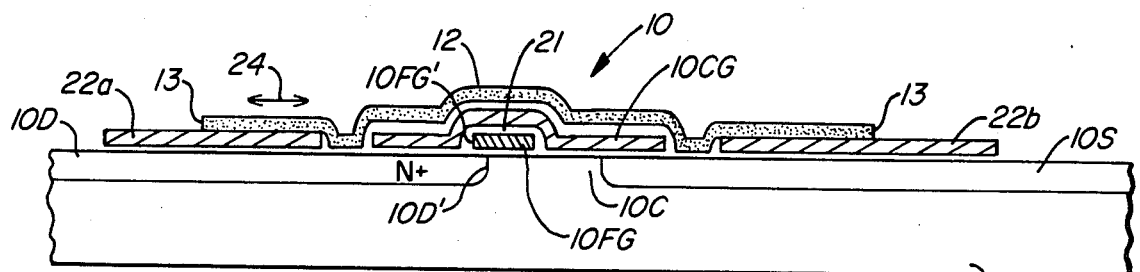
FIG._2.
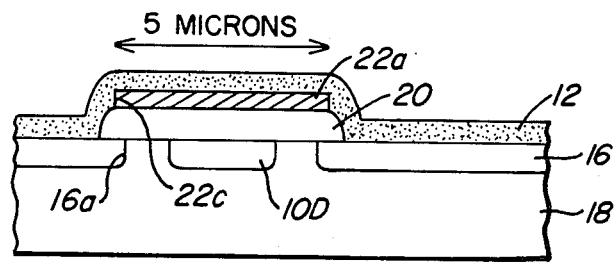
FIG._3.
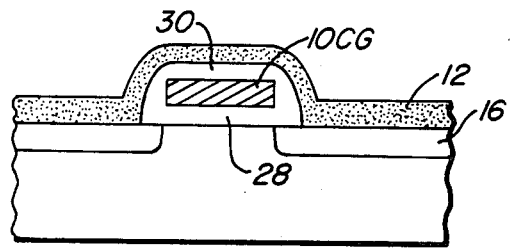
FIG._4.
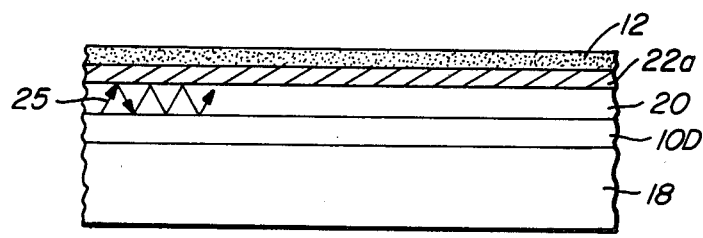
FIG._5.

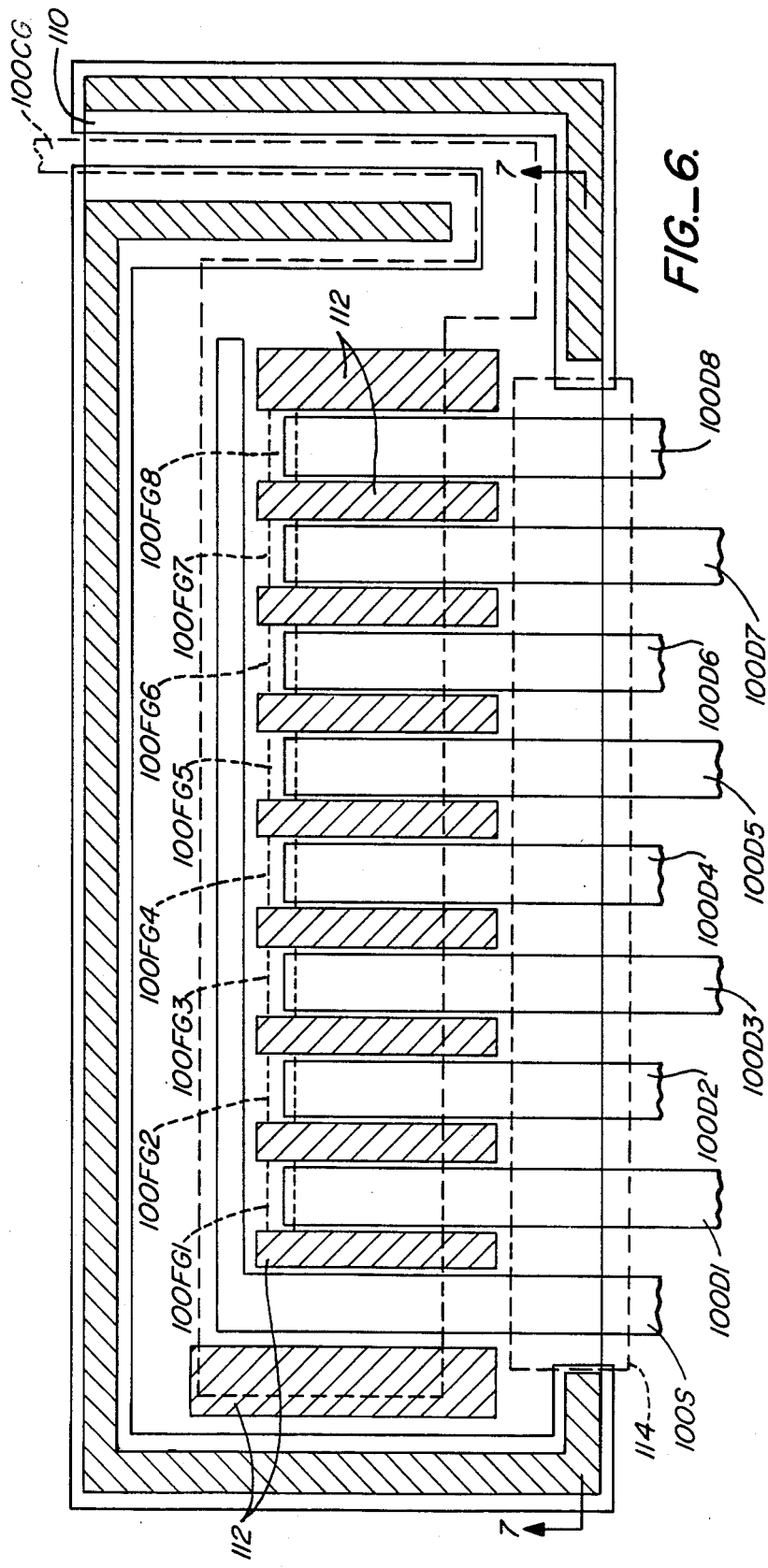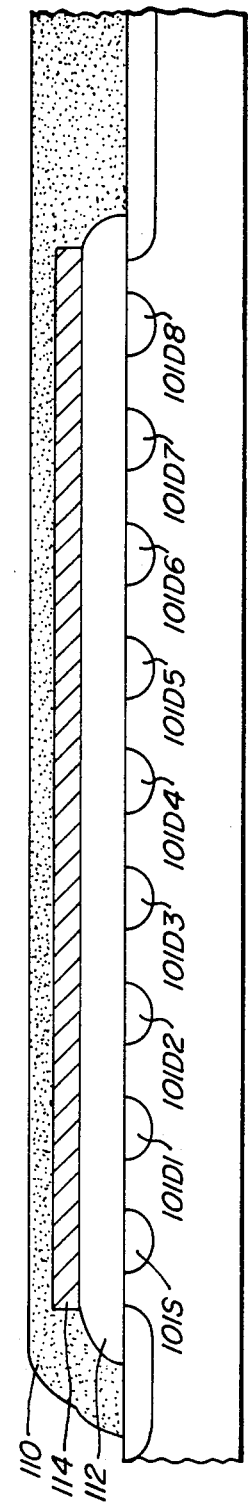

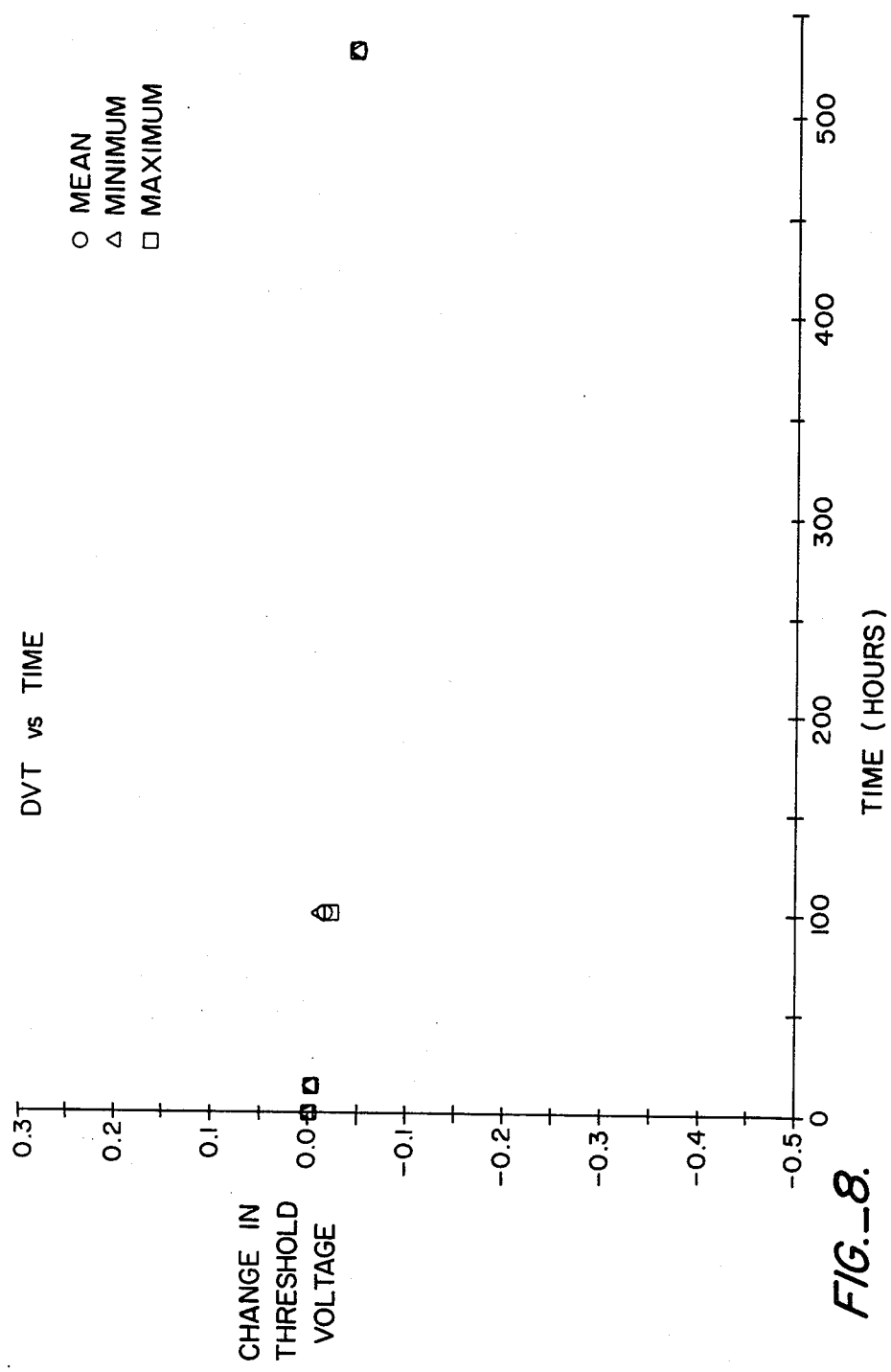
FIG._8.

NONVOLATILE FLOATING GATE TRANSISTOR STRUCTURE

BACKGROUND OF THE INVENTION

This invention relates to a fuse for use in an electronic circuit and in particular to an EPROM cell containing a floating gate for providing a fuse between two portions of a circuit.

A fuse is a device which in response to a signal applied thereto can be converted from one state to another state irreversibly. Typically, a fuse comprises a material which normally conducts current but which can be converted to an open circuit by passing a current pulse through the material so as to heat and destroy the material. It is also known in the art to use floating gate transistors as fuses. Floating gate transistor fuses typically comprise a source and drain region separated by a channel region. A floating gate is formed over the channel region and a control gate is formed over the floating gate. By varying the charge on the floating gate, the threshold voltage required to allow a current to flow between the source and the drain (i.e., to turn on the device) is controlled.

It is known in the art to include floating gate transistor fuses in EPROM circuits which include redundant cells. In such a structure, the fuses permit malfunctioning EPROM cells to be decoupled from an array of EPROM cells and redundant cells to be coupled to the array to replace the malfunctioning cells. A typical floating gate transistor fuse is covered by a metal cover which blocks light from striking the floating gate within the fuse so that the state of the fuse does not change while the rest of the EPROM is being erased. Such a structure is described by Alan C. Folmsbee in a paper entitled "PROM Cell Made With An EPROM Process", published in the International Electron Device Meeting Technical Digest in 1983, incorporated herein by reference.

Most of the periphery of the Folmsbee metal cover directly contacts the silicon surrounding the floating gate transistor in order to minimize the amount of light reaching the floating gate while the remainder of the metal cover is separated from the underlying silicon by an insulating layer of 1.85 micron thick silicon dioxide.

Unfortunately, the Folmsbee structure requires a large surface area, in part because of a large opening in Folmsbee's light blocking metal cover. This opening is necessary to permit access to the drain and control gate of the floating gate transistor. Since the opening is large, it permits a large amount of light to enter underneath the metal cover. In order to reach the Folmsbee floating gate, this light would have to pass through the silicon dioxide insulation layer and repetitively reflect off the metal cover and underlying silicon. (See Folmsbee FIG. 1). Each time the light reflects off the silicon, a portion of the light is absorbed. This absorption prevents the light underneath the metal cover from reaching the floating gate. To permit a large percentage of the light under the metal cover to be absorbed before reaching the floating gate, Folmsbee places his floating gate about 80 microns from the opening.

SUMMARY OF THE INVENTION

In accordance with our invention, a floating gate transistor including an opaque cover is formed which efficiently prevents light from striking the floating gate while minimizing the surface area required for the transistor and opaque cover.

In one embodiment, the source, drain, and floating gate of the transistor are defined and formed prior to the control gate. The control gate is defined to cover the floating gate as well as a portion of the semiconductor material surrounding the floating gate. The control gate helps prevent light from reaching the floating gate. In order for light to reach the floating gate, the light would have to pass through the insulating material underneath the control gate and repetitively reflect off the control gate and the underlying semiconductor material. Because the insulating material underneath the control gate is thinner than the silicon dioxide separating Folmsbee's metal cover and silicon, in order for light to laterally travel a given distance underneath the control gate, it must reflect a greater number of times than light traveling the same distance under Folmsbee's metal cover. Accordingly, light is absorbed more efficiently by our control gate than Folmsbee's metal cover.

An opening is provided in the above-mentioned opaque cover to permit access to the source, drain, and control gate. Of importance, a second insulation layer (typically material under the control gate) is formed over the portion of the source and drain regions at the opening in the opaque cover. A second opaque layer (formed concurrently with and from the same material as the control gate) is formed over the second insulation layer and the opaque cover is formed directly on the second opaque layer. Because the second insulation layer is thin, the amount of light passing through the opening is minimized.

In one embodiment, the floating gate transistor includes a split gate architecture. This eliminates the problem of drain turn-on and reverse programming. (Drain turn-on occurs when capacitive coupling between the floating gate and drain causes the transistor to turn on when the voltage at the drain increases. Reverse programming occurs when an increase in voltage at the source and control gate causes charge to be stored on the floating gate when the drain is grounded.)

In other embodiments of our invention, the floating gate transistor does not include a split gate architecture.

These and other advantages are better understood with reference to the drawings and detailed description below.

BRIEF DESCRIPTION OF THE DRAWINGS

FIG. 1 is a plan view of a transistor 10 constructed in accordance with one embodiment of our invention.

FIG. 1a is a plan view of some of the structures of transistor 10 including field oxide regions 25 adjacent to transistor 10.

FIG. 2 illustrates in cross section the portion of the structure of FIG. 1 indicated by lines 2—2.

FIG. 3 illustrates in cross section the portion of the structure of FIG. 1 indicated by lines 3—3.

FIG. 4 illustrates in cross section the portion of the structure of FIG. 1 indicated by lines 4—4.

FIG. 5 illustrates a beam of light being reflected by the bottom side of a polycrystalline silicon layer and the surface of a semiconductor substrate.

FIG. 6 is a plan view of eight transistors formed under an opaque cover manufactured in accordance with our invention.

FIG. 7 illustrates in cross section the portion of the structure of FIG. 6 indicated by arrows 7—7.

FIG. 8 illustrates the effect of ultraviolet light on the structure of FIG. 1.

DETAILED DESCRIPTION

FIG. 1 is a plan view of a floating gate transistor constructed in accordance with one embodiment of our invention. Transistor 10 is covered by an opaque cover 12 (FIGS. 2 to 4), the lateral extent of which is indicated by line 13. Opaque cover 12 prevents light from striking and affecting charge stored on floating gate 10FG of transistor 10. In one embodiment, the opaque cover 12 is a metal such as aluminum, but it will be appreciated by those skilled in the art that other opaque materials can also be used.

The portions 14 of the opaque cover 12 indicated in section line are in ohmic contact with underlying semiconductor material. Because portions 14 of opaque cover 12 directly contact the underlying semiconductor material, there is no dielectric material such as silicon dioxide between portions 14 and the underlying semiconductor material for light to pass through to affect the charge stored on floating gate 10FG.

FIG. 2 illustrates in cross section the portion of transistor 10 indicated by arrows 2—2. Referring to FIG. 2, it is seen that a drain 10D extends inwardly beyond periphery 13 of opaque cover 12 to the edge of floating gate 10FG. Similarly, a source 10S extends inwardly beyond periphery 13 of opaque cover 12 but does not extend up to the edge of floating gate 10FG. Accordingly, transistor 10 utilizes a split gate EPROM structure. In other words, only part of channel 10C of transistor 10 is covered by floating gate 10FG while the remainder of channel 10C is covered by a control gate 10CG. Split gate structures are well known in the art and are discussed, for example, in U.S. Pat. No. 4,409,723 issued to Eliyahou Harari, incorporated herein by reference. An edge 10D' of drain 10D is typically selfaligned with an edge 10FG' of floating gate 10FG. Advantages of this structure are described in U.S. patent application Ser. No. 06/610,369, filed by Boaz Eitan on May 15, 1984, incorporated herein by reference. Although, the embodiment illustrated in FIGS. 1 through 4 utilizes a split gate structure, in other embodiments of the invention, opaque cover 12 is formed over a floating gate transistor in which the floating gate extends from the source to the drain.

The operation of floating gate transistors is well-known in the art and will not be discussed in detail here. However, it is noted that floating gate transistor 10 is programmed by raising the voltage at control gate 10CG and drain 10D to predetermined values. This causes electrons to be accelerated onto floating gate 10FG. When electrons are stored on floating gate 10FG, the threshold voltage of transistor 10 is increased, typically above 5 volts. However, when floating gate 10FG is electrically neutral, the threshold voltage of transistor 10 is relatively low, e.g., about 1.5 volts. The state of floating gate 10CG is sensed by raising the voltage at control gate 10CG to about 5 volts, providing a voltage between 1 and 5 volts at drain 10D relative to the voltage at source 10S, and sensing any current flowing through transistor 10.

Floating gate transistors such as transistor 10 are typically erased by exposing the transistor to ultraviolet light. However, because opaque cover 12 blocks light from striking floating gate 10FG, transistor 10 cannot be erased and therefore acts as a permanent fuse. Transistor 10 is typically formed in an integrated circuit including a number of other elements, e.g., an array of floating gate transistors not covered by an opaque layer. Such an integrated circuit typically includes a number of extra or redundant floating gate memory cells which can be used to replace malfunctioning floating gate transistors in the array. Transistor 10 is typically used to couple redundant memory cells to the array or decouple malfunctioning memory cells from the array, thereby permitting one to "repair" a malfunctioning integrated circuit. In other embodiments, transistor 10 is used to couple redundant RAM cells to an array of RAM cells. Transistor 10 can also be used to couple other types of devices to various portions of an integrated circuit, as appropriate.

Also illustrated in FIGS. 1 and 2 are polycrystalline silicon layers 22a and 22b which cover portions of drain 10D and source 10S, respectively. Polycrystalline silicon layers 22a and 22b are formed concurrently with control gate 10CG, and extend outwardly from beyond opaque cover 12 to provide additional shading for transistor 10. As described in detail below, this is made possible because source 10S and drain 10D are not self-aligned with polycrystalline silicon layers 22a or 22b.

FIG. 3 illustrates transistor 10 in cross section along arrows 3—3, i.e., the area of transistor 10 at which drain 10D passes underneath the periphery of opaque cover 12. Referring to FIG. 3, it is seen that opaque cover 12 directly contacts a P+ region 16 formed in P substrate 18. Thus, there is no dielectric material separating opaque cover 12 from substrate 18 along most of the periphery of cover 12. Cover 12 is typically connected to ground via P+ region 16 and substrate 18.

Polycrystalline silicon layer 22a directly contacts the bottom side of opaque cover 12. Because of this, it is necessary to provide an insulation region 20 between drain 10D and polycrystalline silicon layer 22a. Insulation layer 20 is typically silicon dioxide formed to a thickness of about 150 to 500 Å at the same time as silicon dioxide layer 21 (FIG. 2) between floating gate 10FG and control gate 10CG. Because silicon dioxide layer 20 is relatively thin, the size of the opening through which light can enter under opaque cover 12 is minimized, and therefore the amount of light entering under opaque cover 12 is minimized.

Further, the amount of light permitted to travel underneath polycrystalline silicon layer 22a through silicon dioxide layer 20 is minimized. To understand why this is so, reference is made to FIG. 5. FIG. 5 illustrates a portion 24 of the cross section of FIG. 2. If light is to enter under opaque cover 12 through silicon dioxide layer 20, it must follow a path which necessitates repetitive reflection off of polycrystalline silicon layer 22a and N+ drain 10D. The thinner one forms silicon dioxide layer 20, the more times light must be reflected off of polycrystalline silicon layer 22a and N+ drain 10D, the more light gets absorbed by polycrystalline silicon layer 22a and N+ drain 10D, and the less light reaches floating gate 10FG.

As will be described below, the edge 22c of polycrystalline silicon layer 22a defines an edge 16a of P+ region 16 formed below opaque cover 12.

Referring to FIG. 1, it is seen that control gate 10CG covers an area of semiconductor material laterally surrounding floating gate 10FG. Control gate 10CG also hinders light from reaching floating gate 10FG because in order to reach floating gate 10FG, light must pass underneath control gate 10CG and repetitively reflect off control gate 10CG and the underlying semiconductor material. This repetitive reflection causes more light to be absorbed by control gate 10CG and the underlying semiconductor material prior to reaching floating gate 10FG. It is noted that to reach floating gate 10FG, light must laterally travel under control gate 10CG a distance greater than distance C or D (about 5 microns).

FIG. 4 illustrates in cross section the portion of transistor 10 indicated by arrows 4—4. As can be seen, silicon dioxide layer 28 (formed concurrently with silicon dioxide layers 20 and 21 and typically 150 to 500 Å thick) is formed underneath control gate 10CG while a silicon dioxide layer 30 electrically insulates control gate 10CG from opaque cover 12. Silicon dioxide layer 30 is typically about 5000 Å to 7000 Å thick. It is therefore easier for light to pass along silicon dioxide layer 30 than it is for light to pass along silicon dioxide layer 20. Accordingly, control gate 10CG extends a relatively long distance before reaching floating gate 10FG in order to permit increased absorption of light by control gate 10CG and to permit less light to reach floating gate 10FG. Of importance, opaque cover 12 ohmically contacts underlying semiconductor substrate 18 in an area 32 (FIG. 1), thereby forming a corridor with portions 14 of opaque cover 12 through which control gate 10CG extends before reaching floating gate 10FG. Control gate 10CG follows a twisted path under cover 12 before reaching floating gate 10FG. Because cover 12 directly contacts the underlying semiconductor substrate 18 at area 32, and because control gate 10CG follows a twisted path to reach floating gate 10FG, the amount of light which reaches floating gate 10FG is further minimized. In the embodiment of FIG. 1, for light to reach floating gate 10FG through silicon dioxide layer 30, the light must pass along a distance A equal to about 12 to 13 microns through layer 30, be reflected toward floating gate 10FG, and then pass underneath control gate 10CG a distance B equal to about 7 microns.

FIG. 8 illustrates the effectiveness of the light blocking structures of FIG. 1. After programming, floating gate transistors such as transistor 10 exhibit a threshold voltage between 6 and 7 volts. After exposure to ultraviolet light for 100 hours, the threshold voltage of a sample of 30 devices dropped an average of about 0.01 volts. After exposure to ultraviolet light for about 550 hours, the threshold voltage dropped by about 0.05 volts. In contrast, the threshold voltage of a conventional uncovered floating gate transistor typically drops from between 6 and 7 volts to about 1.5 volts within 3 minutes when exposed to ultraviolet light of comparable intensity. Accordingly, it is seen that the light blocking structure of FIG. 1 prevents erasure of transistors even after a long period of exposure to ultraviolet light.

The process by which the structure of FIGS. 1 to 5 is formed is as follows:

1. A layer of field oxide (not shown) is grown on portions of P substrate 18 outside of the area bounded by line 13 in the inactive areas of the to be formed integrated circuit. The field oxide is also grown in regions 25 of P substrate 18. (Field oxide 25 is not shown in FIG. 1 for reasons of clarity, but is illustrated along with some of the structures of transistor 10 in FIG. 1a). Field oxide layer 25 is typically about 5000 Å thick. The field oxide is grown in a conventional manner.

2. An insulation layer is formed on P type substrate 18, e.g., by thermal oxidation. A portion of this insulation layer serves as gate insulation between substrate 18 and subsequently formed floating gate 10FG.

3. A first layer of polycrystalline silicon is deposited on the wafer, e.g., by chemical vapor deposition, and then patterned, thereby forming floating gate 10FG. Floating gate 10FG is typically 3000 Å thick.

4. A photolithographic mask is then formed on the wafer to define the source and drain regions. Source 10S and drain 10D are then formed, e.g. by ion implantation. As mentioned above, an edge 10D' of drain 10D is defined by edge 10FG' of floating gate 10FG. Therefore, edge 10D' is self-aligned with floating gate 10FG.

However, the remainder of source and drain regions 10S and 10D are defined independently of any of the other layers or regions formed in or on the semiconductor wafer. This is important since polycrystalline silicon layers 22a and 22b, formed concurrently with subsequently formed control gate 10CG, extend over source 10S and drain 10D to hinder light from reaching floating gate 10FG. If source 10S and drain 10D were defined by the second polycrystalline silicon layer (used to form polycrystalline silicon 22a and 22b and control gate 10CG), it would not be possible to shade source 10S and drain 10D with layers 22a and 22b or extend control gate 10CG over source 10S and drain 10D. After source 10S and drain 10D are formed, the photolithographic mask is then removed.

5. Silicon dioxide formed on the wafer surface (but not covered by floating gate 10FG) is removed. Because field oxide 25 is about 5000 Å thick, only an insignificant portion of the field oxide is removed during this step. A new silicon dioxide layer is then formed on the wafer, e.g., by thermal oxidation. Silicon dioxide layers 21 (above floating gate 10FG), 20, and 28 are formed during this step, typically to a thickness of about 150 to 500 Å.

6. A second polycrystalline silicon layer is formed on the wafer and then patterned to define control gate 10CG and polycrystalline silicon layers 22a and 22b. The second polycrystalline silicon layer is about 3000 Å thick.

7. P+ region 16 is formed at the periphery of to-be-formed opaque cover 12. This is typically done by covering the wafer with a photolithographic mask, patterning the mask, and implanting P type dopants into the underlying semiconductor substrate. Of importance, the edges of polycrystalline silicon layers 22a and 22b (FIG. 3) define part of resulting P+ region 16 so that N+ source 10S and drain 10D are not implanted with P type dopants during this step. Also of importance, polycrystalline silicon layers 22a and 22b are formed to ensure that P+ region 16 is sufficiently separated from drain 10D and source 10S so that a P+N+ junction does not form between region 16 and source 10S or drain 10D. For example, drain 10D and source 10S are typically laterally displaced by about 1 to 2μ from P+ region 16.

8. A silicon dioxide layer 30 is formed above the control gate 10CG, typically to a thickness of about 5000 to 7000 Å. Layer 30 is typically deposited using a chemical vapor deposition process.

9. Portions of silicon dioxide on the wafer are removed where to-be-formed opaque cover 12 is to electrically contact P+ region 16. Silicon dioxide is also removed from the surface of polycrystalline silicon layers 22a and 22b. In addition, silicon dioxide is also removed from the portion of the wafer where metal contacts to various parts of the circuit (including contacts to drain 10D and source 10S) are to be formed. Layers 22a and 22b serve as an etch stop during this step.

10. Opaque cover 12 is formed. Opaque cover 12 is typically aluminum or an alloy of aluminum and is sputtered or evaporated onto the wafer and then patterned using conventional photolithographic techniques. This is typically accomplished concurrently with the formation of metal leads on other parts of the integrated circuit. As mentioned above, opaque cover 12 directly contacts polycrystalline silicon layers 22a and 22b and P+ region 16.

It will be appreciated that the above-described process does not require any more steps than the steps required to form a self-aligned split gate EPROM. In addition, because source 10S and drain 10D are formed independently of control gate 10CG, control gate 10CG can be formed over a portion of the wafer surrounding the transistor to hinder light from reaching floating gate 10FG. Further, without any additional processing steps, polycrystalline silicon layer 22a and 22b are formed to further hinder light from reaching floating gate 10FG.

Also, because of the unique process described above, the thickness of the silicon dioxide at the opening through which source 10S and drain 10D enter underneath opaque cover 12 is only about 150 to 500 Å thick. It is also noted that because transistor 10 is a split gate transistor, the problems of drain turn-on and reverse programming are eliminated.

In an alternative embodiment, instead of forming opaque cover 12, control gate 10CG is formed over a sufficiently large area surrounding transistor 10 so that only a minimal amount of light can reach floating gate 10FG. In this alternative embodiment, control gate 10CG prevents floating gate 10FG from being erased by light incident on the circuit. It is noted that in this alternative embodiment, layers 22a and 22b need not be formed.

It will be appreciated by those skilled in the art in light of this specification that a plurality of transistors such as transistor 10 can be formed under a single opaque cover. FIG. 6 illustrates in plan view eight transistors formed underneath a single opaque cover 110. The structure of FIG. 6, includes a common control gate 100CG, a common source 100S, eight drains 100D1 through 100D8, and eight floating gates 100FG1 to 100FG8. Between each transistor is a field oxide region 112. Each of the transistors in FIG. 6 functions in the same manner as transistor 10 in FIG. 1. The structure of FIG. 6 is manufactured using the same process steps as described above. As can be seen, source 100S and drains 100D1 through 100D8 extend inwardly underneath opaque cover 110.

FIG. 7 illustrates in cross section the portion of the structure of FIG. 6 indicated by arrows 7—7. As can be seen, source 100S and drains 100D1 to 100D8 are vertically separated from opaque cover 110 by a silicon dioxide layer 112 and a polycrystalline silicon layer 114. These layers are similar to silicon dioxide layer 20 and polycrystalline silicon layers 22a and 22b of FIG. 3, respectively.

In other embodiments, instead of using a single source 100S for the transistors of FIG. 7, eight separate sources extend underneath opaque cover 110.

While the invention has been described with regards to specific embodiments, those skilled in the art will recognize that changes can be made to form and detail without departing from the spirit and scope of the invention. For example, the floating and control gate of the above-described transistors can be made from a material other than polycrystalline silicon. In addition, the above-described transistors can be formed in a semiconductor substrate or an epitaxial layer formed on a semiconductor substrate. Accordingly, all such changes come within the present invention.

We claim:

1. A transistor comprising:
   a region of semiconductor material;
   a source formed within said semiconductor material;
   a drain formed within said semiconductor material;
   a floating gate formed above at least a portion of the part of said semiconductor material between said source and drain; and
   means for preventing light from reaching said floating gate, said means for preventing comprising:
      a control gate, said control gate extending over said floating gate, said source, said drain, and the portion of said semiconductor material surrounding said floating gate, said control gate being opaque, said control gate hindering light from reaching said floating gate and removing electrical charge stored on said floating gate; and
      an opaque cover formed on said transistor, said opaque cover also preventing light from reaching said floating gate and removing electrical charge stored on said floating gate,
   said transistor further comprising a first insulation layer for insulating said control gate from said opaque cover, a portion of said opaque cover laterally surrounding said transistor and being in direct contact with said semiconductor material,
   and wherein said drain extends outwardly beyond the edge of said opaque cover, the portion of said drain at said edge of said opaque cover being separated from said opaque cover by a second insulation layer formed on said drain and a second opaque layer formed between said second insulation layer and said opaque cover, said second opaque layer being formed from the same material as said control gate.

2. The structure of claim 1 wherein said control gate covers the entire area surrounding said floating gate within a distance of 1 micron of said floating gate.

3. The structure of claim 1, wherein said second opaque layer directly contacts said opaque cover.

4. The structure of claim 3 wherein said source extends outwardly beyond said edge of said opaque cover, the portion of said source at said edge of said edge of said opaque cover being separated from said opaque cover by a third insulation layer formed on said source and a third opaque layer formed between said third insulation layer and said opaque cover, said third opaque layer being formed from the same material as said control gate.

5. The structure of claim 1 wherein said second opaque layer extends outwardly beyond said edge of said opaque cover to provide additional shading over said drain.

6. The structure of claim 1 wherein said second insulation layer is less than about 700 Å thick.

* * * * *